(12) United States Patent
Van Gorkom et al.

(10) Patent No.: US 8,226,254 B2
(45) Date of Patent: Jul. 24, 2012

(54) LIGHTING SYSTEM WITH DICHROMATIC SURFACES

(75) Inventors: Ramon Pascal Van Gorkom, Eindhoven (NL); Peter Alexander Duine, Eindhoven (NL); Hugo Johan Cornelissen, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 477 days.

(21) Appl. No.: 12/518,293

(22) PCT Filed: Dec. 11, 2007

(86) PCT No.: PCT/IB2007/055026
§ 371 (c)(1),
(2), (4) Date: Jun. 9, 2009

(87) PCT Pub. No.: WO2008/072185
PCT Pub. Date: Jun. 19, 2008

(65) Prior Publication Data
US 2010/0296312 A1    Nov. 25, 2010

(30) Foreign Application Priority Data
Dec. 15, 2006  (EP) .................................... 06126243

(51) Int. Cl.
*F21V 9/02* (2006.01)
(52) U.S. Cl. ............. 362/2; 362/230; 362/231; 362/293
(58) Field of Classification Search ............... 362/2, 230, 362/231, 293
See application file for complete search history.

(56) References Cited

U.S. PATENT DOCUMENTS

| | | | |
|---|---|---|---|
| 5,813,752 A | 9/1998 | Singer et al. | |
| 7,234,820 B2 * | 6/2007 | Harbers et al. | 362/231 |
| 7,497,581 B2 * | 3/2009 | Beeson et al. | 362/84 |
| 2002/0021085 A1 | 2/2002 | Ng | |
| 2006/0171152 A1 | 8/2006 | Suehiro et al. | |

FOREIGN PATENT DOCUMENTS

| | | |
|---|---|---|
| EP | 1566848 A2 | 8/2005 |
| EP | 1605199 A2 | 12/2005 |
| JP | 2005019662 A | 1/2005 |
| JP | 2005216782 A | 8/2005 |
| WO | 2004068597 A1 | 8/2004 |
| WO | 2004068599 A1 | 8/2004 |

* cited by examiner

*Primary Examiner* — William Carter
(74) *Attorney, Agent, or Firm* — Mark L. Beloborodov

(57) ABSTRACT

A high efficiency lighting system (100) is described that has a small etendue. This can be used, for example, for backlighting a display device such as a liquid crystal display (LCD), projection displays, as well as for general lighting purposes. A portion of the light from a light emitting device die (101) falls onto a fluorescent material (105,106), such as phosphor. Dichroic mirrors (107,109) prevent the light generated by the fluorescent material to return to the light-emitting device. The mirrors may also provide collimation of the generated light and the remainder of the light from the light-emitting device. In this way a high efficiency system is realized because little or no generated light is absorbed and the generated light does not have to travel through a fluorescent material layer and thus has a high chance to go in the desired direction.

13 Claims, 3 Drawing Sheets

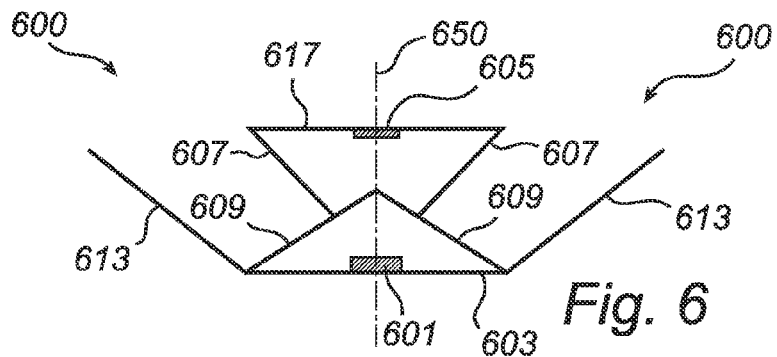
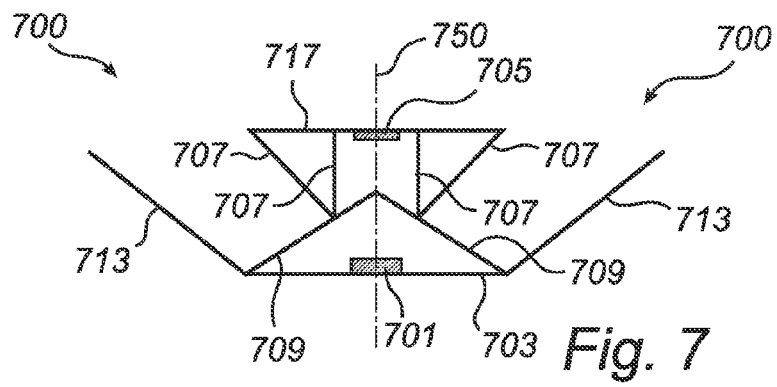
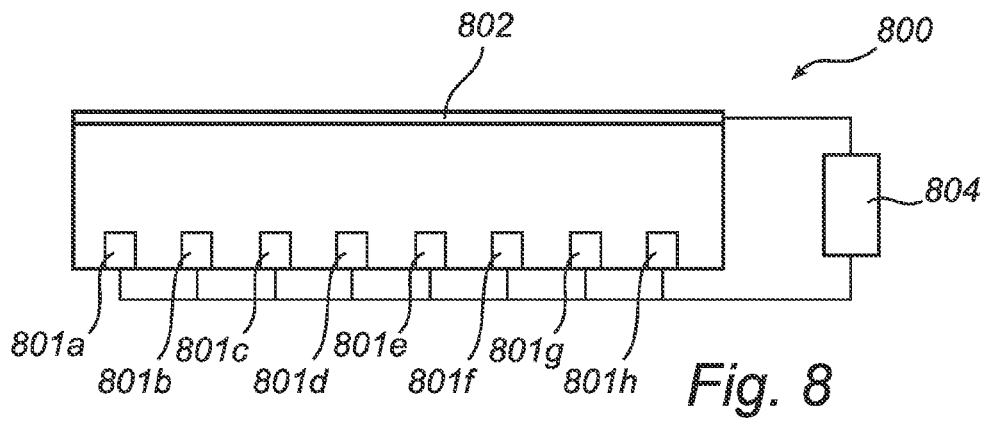
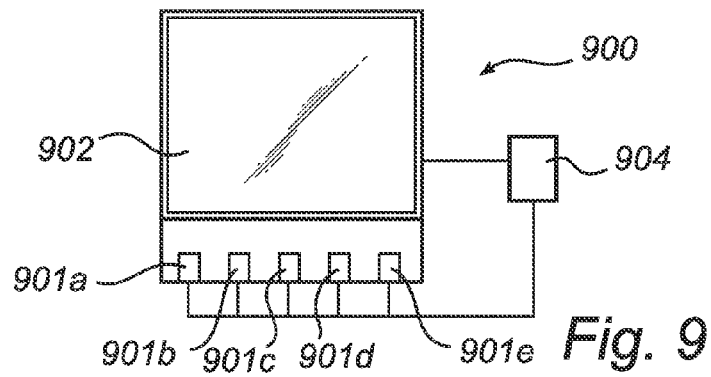

LIGHTING SYSTEM WITH DICHROMATIC SURFACES

TECHNICAL FIELD

The present invention relates to lighting systems where a light-emitting device is arranged with a fluorescent material and dichromatic surfaces.

BACKGROUND

Recently, much progress has been made in increasing the brightness of light emitting device such as light-emitting diodes (LEDs). As a result, it is anticipated that in the years to come, LEDs will become sufficiently bright and inexpensive to serve as a light source in, for example, lamps with adjustable colour, direct view Liquid Crystal Displays (LCDs) and in front and rear projection displays.

Often it is required that a high lumen efficacy is obtained. If LED dies that emit blue light and converting part of the blue light into yellow light are used, a high lumen efficacy may be obtained. Such devices include those where a LED die is covered by a layer of phosphor. However, a drawback with such phosphor covered LED dies is that a lot of the light that is generated exits the phosphor layer in a wrong direction and falls onto the blue die and is absorbed. Because the blue light has to travel through the phosphor layer, while the yellow light is emitted by the phosphor, the blue and yellow light have a different angular distribution. This may result in an undesired discoloration of the light beam in the far field.

Other known solutions include those where place a phosphor layer is arranged relatively far away from a LED and covering a relatively large area. Although the probability may be small that light is emitted back towards the LED, a large phosphor layer is typically needed in such solutions. Another drawback of such devices is that they typically have a large etendue. In fact, for applications such as spotlights, projection displays, side-lit LCDs, it is important to keep the etendue as small as possible. Although, some degree of collimation can be regained by adding, e.g., a so-called Brightness enhancement foil (BEF), such solutions will reflect some of the light in the direction of the source and hence they are not very efficient.

An example of a prior art device is disclosed in European patent application published as EP 1566848. In EP 1566848 a light-emitting device is described, which comprises a LED that is covered by two phosphor layers and where a dichroic filter is arranged between the two-phosphor layers for reducing the amount of backscattered light into the LED.

SUMMARY OF THE INVENTION

An object of the present invention is hence to improve efficiency of lighting systems. This is achieved in different aspects as specified below.

Hence, in a first aspect, there is provided a lighting system that comprises a light emitting device capable of emitting first light having a first peak wavelength and a fluorescent material structure capable of absorbing at least part of the first light and emitting second light having a second peak wavelength. A first dichroic mirror structure capable of reflecting at least part of the first light and transmitting at least part of the second light is arranged in relation to the light emitting device and the fluorescent material structure to facilitate for at least part of the first light in reaching the fluorescent material structure. A second dichroic mirror structure capable of reflecting at least part of the second light and transmitting at least part of the first light is arranged in relation to the light emitting device and the fluorescent material structure to prevent at least part of the second light from reaching the light emitting device.

That is, by providing such an arrangement of dichroic mirrors that reflects and transmits the first and second light it is possible to obtain a mix of light from the system having a relatively small etendue. In comparison with prior art systems, there is no need to cover the light-emitting device with the fluorescent material. Rather, the fluorescent material may be placed apart from the light-emitting device. Thereby, the light that is generated by the fluorescent material does not need to pass through the fluorescent material, which leads to a number of advantages. For example, an improved efficiency in the conversion of first light to second light. It is also advantageous because it is much easier to manufacture such a fluorescent material, due to the fact that there is no need to accurately control a layer thickness. The efficiency is even further improved in that the arrangement of the dichroic mirrors prevent second light from being absorbed by the light-emitting device. Furthermore more light will be emitted in the desired direction, that is a certain degree of collimation is obtained.

In this way a high efficiency system is realized because little or no generated light is absorbed and the generated light does not have to travel through a fluorescent material layer and thus has a high chance to go in the desired direction.

These effects and advantages are further accentuated in embodiments where a third mirror structure is arranged that is capable of reflecting at least the second light to at least partly collimate light out of the system in a direction of collimation, as well as embodiments where the light emitting device and the fluorescent material structure are spatially separated and the second dichroic mirror structure is arranged between the light emitting device and the fluorescent material structure.

Moreover, the first dichroic mirror structure may comprise a surface that enables concentration of at least part of the first light onto the fluorescent material structure. This is a way to increase the amount of light that falls onto the fluorescent material. For example, this may entail arranging additional reflecting dichroic surfaces, which redirect the light from the light-emitting device more directly towards the fluorescent material. This may be obtained by use of straight mirror surfaces or curved mirror surfaces. One example of such a mirror arrangement is an elliptical mirror (or more generally a curved mirror), arranged such that the light-emitting device is in first focus of the ellipsoidal dichroic mirror and the fluorescent material in second focus.

The first and/or second mirror structure may be arranged in relation to the third dichroic mirror structure such that they enable collimation of at least part of the first light and/or at least part of the second light, respectively. By a suitable arrangement of the mirror/mirrors, the light that the system generates may be collimated to a desirable degree and thereby providing a lighting system having a desired small etendue.

Furthermore, the light emitting device and the fluorescent material structure may be arranged in a common plane, the common plane being perpendicular to the direction of collimation. Alternatively, the light emitting device and the fluorescent material structure may be arranged in the direction of collimation. Such embodiments further accentuates the advantage that, by the fact that the fluorescent material is placed apart from the light emitting device, the light that is generated by the fluorescent material does not need to pass through the fluorescent material.

The mirror structures may comprise any combination of flat and curved surfaces, depending on application and other considerations that may relate to manufacturing costs etc. For example, as discussed above, by providing an elliptic mirror structure, the first light may be concentrated to a desired extent onto the fluorescent material.

Embodiments include those where the fluorescent material structure comprises any of a phosphor material, a luminescent ceramic material, a laser and upconversion phosphor material. Embodiments also include those where the fluorescent material structure comprises a down conversion phosphor material. Moreover, the light-emitting device in any embodiment may comprise a semiconductor light-emitting device.

A display device comprising a lighting system as described above will gain at least the advantages discussed above that relate to the efficiency.

Hence, in summary, embodiments of the invention provide a high efficiency lighting system which has a small etendue. This can be used, for example, for backlighting a display device such as a liquid crystal display (LCD), projection displays, as well as for general lighting purposes. The basic idea behind the embodiments is to have a portion of the light from a light emitting device die fall onto a fluorescent material, such as phosphor. Dichroic mirrors prevent the light generated by the fluorescent material to return to the light-emitting device. Furthermore these mirrors may also provide collimation of the generated light and the remainder of the light from the light-emitting device. In this way a high efficiency system is realized because little or no generated light is absorbed and the generated light does not have to travel through a fluorescent material layer and thus has a high chance to go in the desired direction. In this way a high efficiency system is realized because little or no generated light is absorbed and the generated light does not have to travel through a fluorescent material layer and thus has a high chance to go in the desired direction.

These and other aspects of the invention will be apparent from and elucidated with reference to the embodiment(s) described hereinafter.

BRIEF DESCRIPTION OF THE DRAWINGS

FIGS. 6 and 7 show, in diagrammatic form, views in cross section of yet further embodiments of a lighting system.

FIGS. 8 and 9 show, in diagrammatic form, a view in cross section and a top view, respectively, of embodiments of display devices incorporating a respective lighting system.

PREFERRED EMBODIMENTS

Figure 1A:
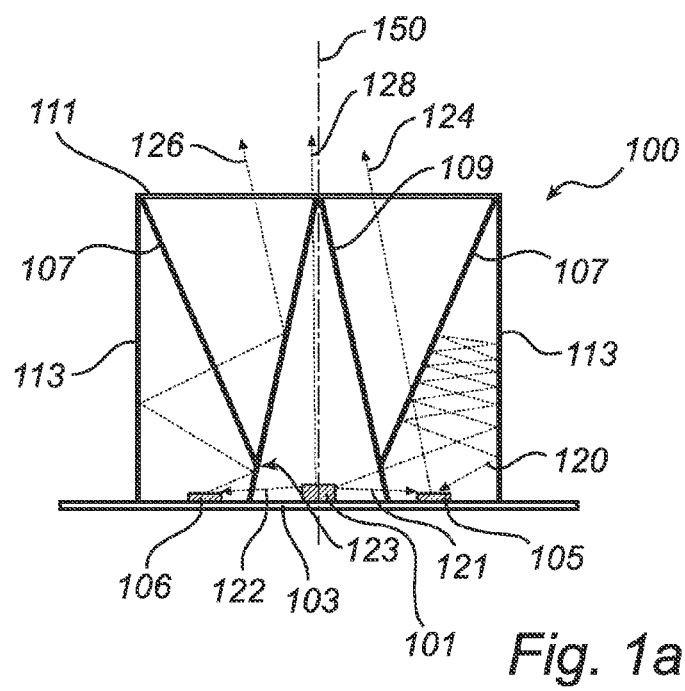
FIGS. 1a and 1b show, in diagrammatic form, a view in cross section and a top view, respectively, of an embodiment of a lighting system.

Before continuing with a detailed description, it should be pointed out that the illustrated embodiments are only described using two colours of light, for example blue light emitted by light emitting devices and yellow light emitted by fluorescent materials. However, this can easily be extended to including materials capable of emitting other colours. For example, conversion of light from longer wavelengths to shorter wavelengths is also feasible, for example by using a red light emitting device. Moreover, although the illustrated embodiments all show single semiconductor light emitting devices, e.g. light emitting diodes, other types of light sources are also possible, including those where a plurality of individual light emitting devices, possibly with different colours, are arranged together with dichroic mirror structures.

Although most surfaces shown in the embodiments are flat, all surfaces can be flat or curved (e.g. CPC).

A typical implementation of the fluorescent material is a normal phosphor. Hence, for simplicity of description, reference will frequently be made to phosphor in the description to follow. However, it is also possible to use "lumiramics", i.e., a luminescent ceramic, or in fact any material that can transform one colour light into another colour light, such as lasers, upconversion phosphors etc.

Although not described in any embodiment, it is also possible to place the fluorescent material only on one side of the light-emitting device. Such a configuration will give an asymmetric far field radiation pattern.

In the description of the embodiments, reference will often be made using spatial expressions such as "top", "bottom", "above", "below", etc. However, such expressions are only used for the purpose of simplifying the description when referring to the drawings. In fact, any orientation of the arrangements is possible, as the skilled person will realize. Furthermore, most of the embodiments will be described with reference to a respective figure that is presented as a cross sectional, i.e. two-dimensional, view. This is not to be interpreted as any restriction with respect to the respective embodiment's extent in the third dimension. In other words, the embodiments may be curved or have any polygon shape when viewed from above.

Figure 1B:
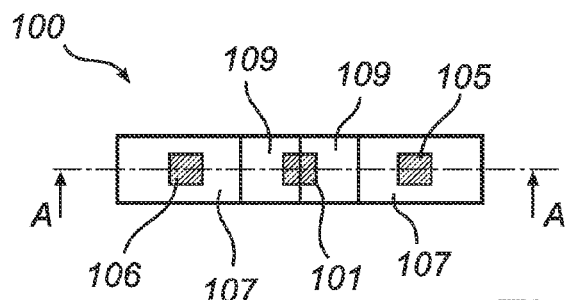

Turning now to FIGS. 1a and 1b, a first embodiment of a lighting system 100 will be described. FIG. 1a is a side view in cross section AA and FIG. 1b is a view from above.

A light emitting diode (LED) 101, capable of emitting blue light 120, 121, 122, 128, is mounted on a substrate 103, on each side of which is arranged two phosphor structures 105, 106 in the form of "dots". The two-phosphor dots 105, 106 convert the blue light 120, 121, 122 from the LED 101 into yellow light 124, 126.

Above the phosphor dots 105, 106 is a first dichroic mirror structure 107 arranged, which is capable of reflecting the blue light 120 from the LED 101 and transmit the light 124 from the phosphor dots 105, 106.

Above the blue LED 101 is a second dichroic mirror structure 109 arranged, which is capable of reflecting the light 126 from the phosphor dots 105, 106 and transmit the light 120, 121, 122, 128 from the LED 101, such that no light from the phosphor dots 105, 106 can find it's way back to the LED and thereby be absorbed.

The blue light 121, 122 is allowed to reach the phosphor dots 105, 106 through a gap 123 between the first mirror structure 107 and the substrate 103, directly as well as via reflections involving also a third mirror structure 113 as illustrated by the multiple reflections of light path 120. A mixture of light, emanating from the LED as well as the phosphor dots 105, 106, is emitted out of the system 100 in the general direction of an axis 150 of the system 100. The emission in the direction of the axis 150 is aided by the third mirror structure 113, which hence adds a certain degree of collimation of the emitted mixture of light. An optional diffuser 111 may be arranged on top of the system 100 in order to further enhance the mixing of the emitted light.

Figure 2:
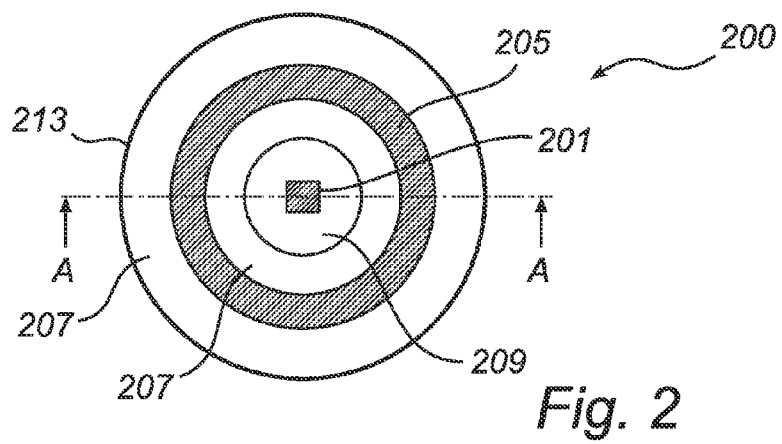
FIG. 2 shows, in diagrammatic form, a top view of another embodiment having the same cross sectional side view as the embodiment of FIG. 1.

FIG. 2 shows a top view of another embodiment of a lighting system 200. The system 200 has the same side view in cross section AA as the embodiment of FIG. 1a, but instead of the generally "linear" structure of the system in FIG. 1a, a circular symmetric structure is shown. A LED 201, corresponding to LED 101 of FIG. 1a, is mounted in a central position. A first and second dichroic mirror structure 207 and 209 are also indicated, corresponding to the respective first and second mirror structure 107 and 109 of FIG. 1a. An annular phosphor structure 205, corresponding to the phosphor structures 105, 106 in FIG. 1a, is also shown.

Turning now to FIGS. 3 to 7, a number of different embodiments of light systems will be described. It should be noted that, while the examples described in connection with FIGS. 1 and 2 include several examples of light path illustrations, in order to simplify the description, only a few light paths will be illustrated in FIGS. 3 to 7. Furthermore, similar to FIG. 1a, FIGS. 3 to 7 are side views and partial side views in cross section that, when viewed from above may have a linear as well as a circular structure similar to the examples described in connection with FIG. 1b and FIG. 2.

Hence, now with reference to FIG. 3, a second embodiment of a lighting system 300 will be described.

A light emitting diode 301 (LED), capable of emitting blue light 321, 322 is mounted on a substrate 303, on each side of which is arranged two phosphor structures 305, 306 in the form of "dots". The two-phosphor dots 305, 306 convert the blue light 321, 322 from the LED 301 into yellow light 324, 326.

Above the phosphor dots 305, 306 is a first dichroic mirror structure 307 arranged, which is capable of reflecting blue light (not shown in FIG. 3) from the LED 301 and transmit yellow light 324 from the phosphor dots 305, 306.

Above the blue LED 301 is a second dichroic mirror structure 309 arranged, which is capable of reflecting the light 326 from the phosphor dots 305, 306 and transmit the light 321, 322 from the LED 301, such that no light from the phosphor dots 305, 306 can find it's way back to the LED 301 and thereby be absorbed.

The blue light 321, 322 is allowed to reach the phosphor dots 105, 106 through a gap 123 between the first mirror structure 307 and the substrate 303, directly as well as via reflections as described above. A mixture of light, emanating from the LED as well as the phosphor dots 305, 306, is emitted out of the system 300 in the general direction of an axis 350 of the system 300. The emission in the direction of the axis 350 is aided by a third mirror structure 313, which hence adds a certain degree of collimation of the emitted mixture of light. An optional diffuser 311 may be arranged on top of the system 300 in order to further enhance the mixing of the emitted light.

Figure 3:
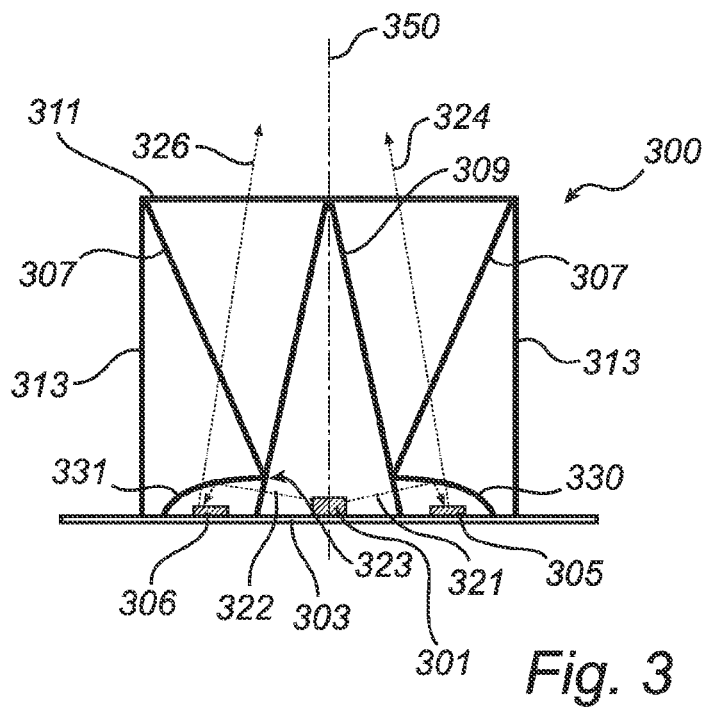
FIG. 3 shows, in diagrammatic form, a view in cross section of another embodiment of a lighting system.

The embodiment in FIG. 3 is one where the amount of light that falls onto the phosphor dots 305, 306 is increased, in comparison with the embodiments described with reference to FIGS. 1 and 2. Here the first mirror structure 307 is configured with a light concentration part 330, 331, which redirects the light 321, 322 from the light emitting diode 301 more directly towards the phosphor dots 305, 306. In FIG. 3 the light concentration part 330, 331 is in the form of elliptical surfaces (although more generally curve shapes may be utilized). The relative placement of the light emitting diode 301 and the respective phosphor dot 305, 306 may, for example, be such that the light emitting diode 301 is in first focus of the ellipsoidal shape and the respective phosphor dot 305, 306 is in second focus.

Figure 4:
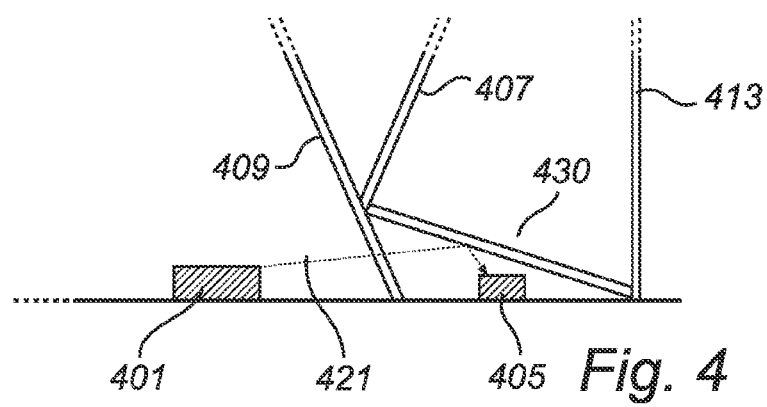
FIGS. 4 and 5 show, in diagrammatic form, partial views in cross section of further embodiments of a lighting system.

FIG. 4 illustrates an embodiment similar to that of FIG. 3. Only a part of a complete lighting system is depicted. Here, the cross section of a light concentration part 430 of a first mirror structure 407 is straight. A second mirror structure 409 and a third mirror structure 413 are also indicated. The light concentration part 430 redirects light 421 from a light emitting diode 401 more directly towards a phosphor dot 405 in a similar manner as described above with reference to FIG. 3.

Figure 5:
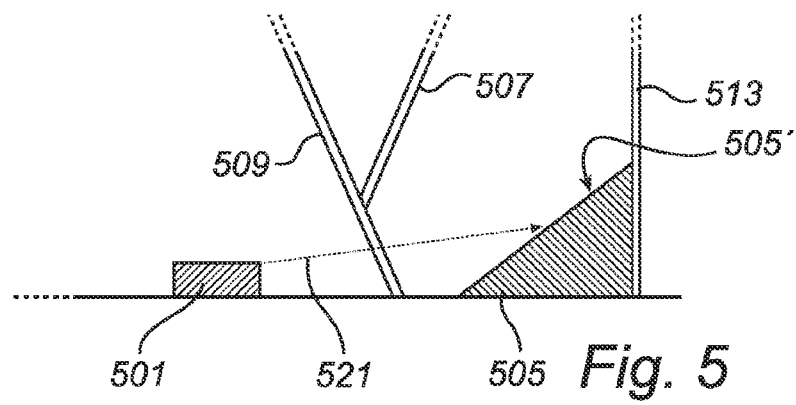

Turning now to FIG. 5, yet an embodiment similar to that of FIG. 4 will be described. First, second and third mirror structures 507, 509, 513 are arranged in relation to a light emitting diode 501 and a phosphor dot 505. As is illustrated in FIG. 5, the amount of light that reaches the phosphor dot 505 from the light emitting diode 501 can also be increased by arranging the phosphor dot 505 with a slanted surface 505', more or less facing the light emitting diode 505.

Further embodiments of lighting systems are illustrated in FIGS. 6 and 7. FIGS. 6 and 7 are cross sectional views of lighting systems 600, 700 that may be, e.g., circular in a view from above along an axis 650, 750. Here, a light emitting diode 601, 701 is arranged on a substrate 617, 717 similar to the situations described above. However, a single phosphor dot 605, 705 is arranged in line along the axis 650, 750 with the light emitting diode 601, 701.

Similar to the examples described above, a first 607, 707 and a second 609, 709 dichroic mirror structure is arranged in relation to the light emitting diode 601, 701 and the phosphor dot 605, 705 and transmit and reflect light from the LED 601, 701, such that no light from the phosphor dot 605, 705 can find it's way back to the LED 601, 701 and thereby be absorbed.

Turning now to FIGS. 8 and 9, embodiments of display systems will be described. The display systems 800, 900 may, e.g., form part of larger systems such as a computer or any type of communication apparatus that require a display system.

A first embodiment of a display system 800 is illustrated in a cross sectional view in FIG. 8. An LCD display screen 802 is arranged in relation to a plurality of lighting systems 801a-h that act as a backlighting system for the LCD screen 802. Any of the lighting systems 801a-h may be of any of the type of embodiments described above in connection with FIGS. 1 to 7. Electronic control circuitry 804 is configured to control both the LCD screen, i.e. the display content of the screen, and the backlighting systems 801.

A second embodiment of a display system 900 is illustrated in a frontal view in FIG. 9. An LCD display screen 902 is arranged in relation to a plurality of lighting systems 901a-h that act as a side lighting system for the LCD screen 902. Any of the lighting systems 901a-h may be of any of the type of embodiments described above in connection with FIGS. 1 to 7 as well as lighting systems having only first and second mirror structures. Electronic control circuitry 904 is configured to control both the LCD screen, i.e. the display content of the screen, and the side lighting systems 901.

The invention claimed is:

1. A lighting system comprising:
    a light emitting device for emitting first light having a first peak wavelength,
    a fluorescent material structure for absorbing at least part of the first light and emitting second light having a second peak wavelength,
    a first dichroic mirror structure for reflecting at least part of the first light and transmitting at least part of the second light and arranged in relation to the light emitting device and the fluorescent material structure to facilitate for at least part of the first light in reaching the fluorescent material structure,
    a second dichroic mirror structure for reflecting at least part of the second light and transmitting at least part of the first light and arranged in relation to the light emitting device and the fluorescent material structure to prevent at least part of the second light from reaching the light emitting device, wherein the light emitting device and the fluorescent material structure are spatially separated and the second dichroic mirror structure is arranged between the light emitting device and the fluorescent material structure.

2. The lighting system according to claim 1, further comprising a third dichroic mirror structure for reflecting at least part of the second light arranged to at least partly collimate light out of the system in a direction of collimation.

3. The lighting system according to claim 2, wherein the first mirror structure is arranged in relation to the third dichroic mirror structure such that it enables collimation of at least part of the first light.

4. The lighting system according to claim 2, wherein the second mirror structure is arranged in relation to the third dichroic mirror structure such that it enables collimation of at least part of the second light.

5. The lighting system according to claim 1, wherein the first dichroic mirror structure comprises a surface that enables concentration of at least part of the first light onto the fluorescent material structure.

6. The lighting system according to claim 1, wherein the light emitting device and the fluorescent material structure are arranged in a common plane, the common plane being perpendicular to the direction of collimation.

7. The lighting system according to claim 1, wherein the light emitting device and the fluorescent material structure are arranged in the direction of collimation.

8. The lighting system according to claim 1, wherein the first or the second dichroic mirror structures comprises a flat mirror surface.

9. The lighting system according to claim 1, wherein the first or the second dichroic mirror structures comprises a curved mirror surface.

10. The lighting system according to claim 1, wherein the fluorescent material structure comprises any of a phosphor material, a luminescent ceramic material, a laser and upconversion phosphor material.

11. The lighting system according to claim 1, wherein the fluorescent material structure comprises a down conversion phosphor material.

12. The lighting system according to claim 1, wherein the light-emitting device comprises a semiconductor light-emitting device.

13. A display device comprising a lighting system according to claim 1.

* * * * *